(12) United States Patent
Park et al.

(10) Patent No.: US 8,719,672 B2
(45) Date of Patent: May 6, 2014

(54) METHOD OF SETTING NUMBER OF ITERATION COUNTS OF ITERATIVE DECODING, AND APPARATUS AND METHOD OF ITERATIVE DECODING

(75) Inventors: Joo-Yul Park, Seoul (KR); Ki-Seok Chung, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 216 days.

(21) Appl. No.: 13/382,476

(22) PCT Filed: Oct. 12, 2009

(86) PCT No.: PCT/KR2009/005842
§ 371 (c)(1),
(2), (4) Date: Jan. 5, 2012

(87) PCT Pub. No.: WO2011/004939
PCT Pub. Date: Jan. 13, 2011

(65) Prior Publication Data
US 2012/0131415 A1    May 24, 2012

(30) Foreign Application Priority Data

Jul. 7, 2009    (KR) .................... 10-2009-0061902

(51) Int. Cl.
*H03M 13/00*    (2006.01)

(52) U.S. Cl.
USPC ........... 714/774; 714/748; 714/752; 714/755; 714/758

(58) Field of Classification Search
USPC .................. 714/748, 752, 755, 758, 774
See application file for complete search history.

(56) References Cited

U.S. PATENT DOCUMENTS

| 2007/0011573 A1* | 1/2007 | Farjadrad et al. | 714/760 |
| 2007/0022354 A1* | 1/2007 | Yu et al. | 714/755 |
| 2010/0272011 A1* | 10/2010 | Palanki et al. | 370/328 |

FOREIGN PATENT DOCUMENTS

| KR | 10-2001-0048292 A | 6/2001 |
| KR | 10-2001-0099785 A | 11/2001 |
| KR | 10-2002-0074222 A | 9/2002 |
| KR | 10-2003-0016720 A | 3/2003 |
| KR | 10-2008-0026559 A | 3/2008 |

* cited by examiner

*Primary Examiner* — Sam Rizk

(57) ABSTRACT

A method of setting a number of iteration counts of iterative decoding, and an apparatus and method of iterative decoding. The iterative decoder including a signal-to-noise ratio (SNR) estimation unit that estimates an SNR of a received signal, an iterative decoding count setting unit that sets a minimum number of iteration counts for the received signal based on the estimated SNR, and a decoding unit that iteratively decodes the received signal using tentative decoding and error check, and selectively performs the error check based on the minimum number of iteration counts.

7 Claims, 3 Drawing Sheets

Fig. 5

1: {Initilization :}

Set iteration number $i=0$, and $F_n$ (LLR) for bit nodes $(n=1,2,\cdots,N)$ and for each $(m,n)$ if $H_{mn}=1$ set $Z_{mn}=F_n$ (1)

2: while $i \leq i_{max}$

3:     for all (the check node) do where each set $(m,n)$ if $H_{mn}=1$ $$L_{mn} = \left(\prod_{n' \in N(m)\setminus n} sign(Z_{mn'})\right) \cdot \min_{n' \in N(m)\setminus n} |Z_{mn'}| \cdot \alpha \quad (2)$$

4:     end for

5:     for all (the bit node) do where each set $(m,n)$ if $H_{mn}=1$ $$Z_{mn} = F_n + \sum_{m' \in M(n)\setminus m} L_{m'n} \quad \text{Update} \quad (3)$$

$$z_n = F_n + \sum_{m \in M(n)} L_{mn} \quad (4)$$

6:     end for

7:     if( $i > i_{min}$ )

8:        for all $\hat{c}_n$ for $(n=1,2,\cdots,N)$ Compute all the tentative do $$\hat{c} = [\hat{c}_n], \quad \begin{cases} \hat{c}_n = 1 & \text{if } z_n > 0 \\ \hat{c}_n = 0 & \text{if } z_n < 0 \end{cases} \quad (5)$$

9:        end for

10:        for all $\hat{c}_n$ for $(n=1,2,\cdots,N)$ Parity Check do $$H \cdot [\hat{c}_1, \hat{c}_2, \cdots, \hat{c}_N]^T = \begin{cases} 0 & \text{return sucess} \\ 1 & \text{continue } i\text{+} \end{cases} \quad (6)$$

11:        end for

12:     endif

13:     else if continue $i$+

14:     end if

15: end while

METHOD OF SETTING NUMBER OF ITERATION COUNTS OF ITERATIVE DECODING, AND APPARATUS AND METHOD OF ITERATIVE DECODING

TECHNICAL FIELD

The present invention relates to a method of setting a number of iteration counts of iterative decoding, and an apparatus and method of iterative decoding.

BACKGROUND ART

In fourth generation (4G) wireless mobile communication systems, high-speed data transfer services and low error rates are required in order to offer users a variety of advanced multimedia services. More specifically, in 4G wireless mobile communication, a data transfer rate of a maximum of 100 Mbps for high-speed data throughput and a data transfer rate in a range of 155 Mbps to 1 Gbps for low-speed transfer or suspension are required Therefore, in order to perform high quality and highly reliable channel communication under extreme transmission conditions, it is essential to apply coding/decoding techniques. Channel coding schemes can be adaptively used in various manners according to channel characteristics. In the channel coding schemes, signal coding/decoding techniques using error correcting codes are basically employed.

Error correction codes are used to achieve reliable communication in unreliable channels. One representative error correction code is a low density parity check (LDPC) code. Coding/decoding using LDPC codes is referred to as 'LDPC coding'.

DISCLOSURE OF INVENTION

Technical Problem

LDPC coding employs a simple probabilistic decoding method, in which a received signal is decoded by iterative decoding. The LDPC code is defined as a parity check matrix, in which most elements have a value of 0 and the other elements have a non-zero value, e.g., 1.

In the LDPC coding scheme, in each decoding operation during the iterative decoding, a tentative code is generated through tentative decoding and a parity check is performed to determine whether the tentative code generated is a valid codeword. If the generated tentative code is not a valid codeword, the decoding operation is iteratively performed. If the generated tentative code is a valid codeword, the decoding operation is terminated. In this regard, as the number of iteration counts of decoding iteratively performed increases, the probability of the generated tentative code being a valid codeword increases.

In a case of a received signal having a large number of iteration counts of decoding iteratively performed, the probability of the tentative code generated at an initial decoding stage being a valid codeword is very low, suggesting that the error check performed in the initial decoding stage may be a redundant step. Accordingly, the number of operations performed in decoding may considerably increase, resulting in a delay in the processing speed of decoding, and an increase in power consumption.

Solution to Problem

To solve the above problems, it is an object of the present invention to provide an apparatus and method of iterative decoding, whereby the number of operations and power consumption required when decoding a received signal can be reduced.

To accomplish the above object of the present invention, in accordance with an aspect of the present invention, there is provided an iterative decoder including a signal-to-noise ratio (SNR) estimation unit that estimates an SNR of a received signal, an iterative decoding count setting unit that sets a minimum number of iteration counts for the received signal based on the estimated SNR, and a decoding unit that iteratively decodes the received signal using tentative decoding and error check, and selectively performs the error check based on the minimum number of iteration counts.

In accordance with another aspect of the present invention, there is provided a method of setting a number of iteration counts of an iterative decoder of iteratively decoding a received signal using tentative decoding and error check, the method including estimating a signal to noise ratio (SNR) of a received signal, and setting a minimum number of iteration counts based on the estimated SNR, wherein the minimum number of iteration counts is a number of iteration counts used for the iterative decoder to determine whether to perform the error check or not.

In accordance with a further aspect of the present invention, there is provided a method of iteratively decoding including estimating a signal to noise ratio (SNR) of a received signal, setting a minimum number of iteration counts for the received signal based on the estimated SNR, and iteratively decoding the received signal using tentative decoding and error check, wherein the iteratively decoding is to selectively perform the error check based on the minimum number of iteration counts.

According to the present invention, the number of operations and power consumption required when iteratively decoding a received signal can be reduced.

BRIEF DESCRIPTION OF DRAWINGS

FIG. 5 illustrates an algorithm of a LDPC decoding operation as an example of iterative decoding according to an embodiment of present invention.

MODE FOR THE INVENTION

Figure 1:
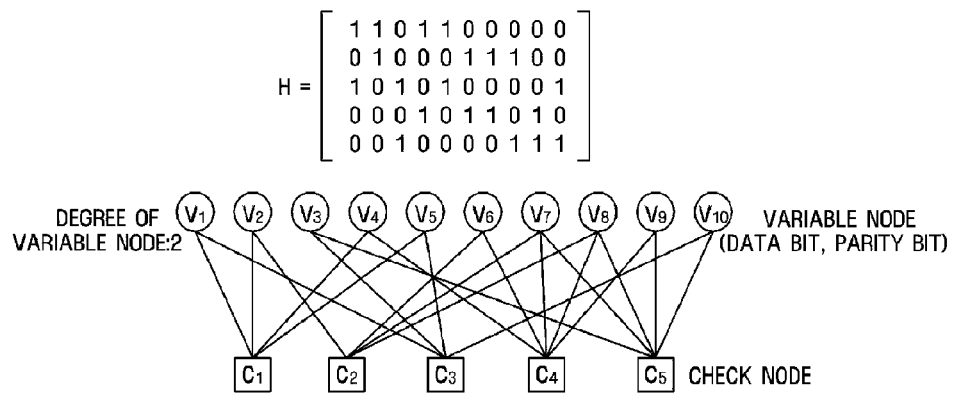
FIG. 1 is a diagram for explaining the concept of low density parity check (LDPC) coding.

Hereinafter, low density parity check (LDPC) coding as an exemplary iterative coding scheme will first be described briefly, and exemplary embodiments of the present invention will then be described in detail with reference to the attached drawings. In the present disclosure, for a better understanding of the present invention, the same reference numerals are used to denote the same elements throughout the drawings.

FIG. 1 is a diagram for explaining the concept of LDPC coding, in which an example of a parity check matrix and a factor graph corresponding to the parity check matrix are illustrated.

A LDPC code, which is a block code, is defined as a parity check matrix. In order to reduce the complexity of the decoding operation, the LDPC code employs a parity check matrix having a small number of 1s. In the LDPC code, decoding may be performed by applying a soft decision decoding technique such as a sum-product algorithm or a min-sum algorithm.

It is assumed that source data has k bits and coded data based on the LDPC code has n bits. Here, n bit coded data has k bit data and (n−k) bit parities. Here, assuming that the k bit data and (n−k) bit parities correspond to variable nodes and check bits correspond to check nodes, the parity check matrix can be defined based on the relationship between the variable nodes connected to the check nodes.

An LDPC coder can generate coded data with constraints represented in the following equation (1):

$$Hx=0$$

$$x=Gu^T$$

where H denotes an m×n dimensional parity check matrix, m denotes the number of check nodes, X denotes n bit coded data (codeword), u denotes k bit source data, and G denotes an n×k dimensional generating matrix, respectively.

The number of 1s included in each column of the parity check matrix is referred to as a degree of the variable node. In addition, the number of is included in each row of the parity check matrix is referred to as a degree of the check matrix. When degrees of variable nodes for each column are all equal to each other or degrees of check nodes for each row are all equal to each other, the LDPC code is a regular LDPC code. When degrees of variable nodes for each column are different from each other or degrees of check nodes for each row are different from each other, the LDPC code is an irregular LDPC code.

Referring to FIG. 1, a parity check matrix H is defined based on a relationship between variable nodes $v_1, v_2, \ldots v_{10}$ and corresponding check nodes $c_1, c_2, \ldots c_5$. The variable nodes $v_1, v_2, \ldots v_{10}$ correspond to coded data, which has data bits and parity bits, and the check nodes $c_1, c_2, \ldots c_5$ correspond to check bits. The dimensions of the parity check matrix H refer to a product of the number of variable nodes $v_1, v_2, \ldots v_{10}$ and the number of check nodes $c_1, c_2, \ldots c_5$, that is, 5×10.

In a factor graph illustrating the relationship between the variable nodes $v_1, v_2, \ldots v_{10}$ and the check nodes $c_1, c_2, \ldots c_5$, since $v_1$ is connected to $c_1$ and $c_3$ in the parity check matrix H, an element of column 1, row 1 and an element of column 1, row 3 are both '1', and the other elements belonging to column 1 are all '0'. Likewise, since $v_2$ is connected to $c_1$ and $c_2$, an element of column 2, row 1 and an element of column 2, row 2 are both '1', and the other elements belonging to column 2 are all '0'. In the above-described manner, all of the elements in the parity check matrix H have a value of 1 or 0.

The degrees of variable nodes are equal to the number of lines connected to the respective variable nodes, and the degrees of check nodes are equal to the number of lines connected to the check nodes. That is to say, as indicated in the factor graph shown in FIG. 1, since two lines are connected to each variable node, it can be appreciated that the degrees of the variable nodes are all '2'. The check nodes have a degree of '4'.

When decoding is performed on the data coded using the aforementioned coding method, variable nodes and check nodes transmit decoding results to other nodes connected thereto, or receive decoding results of other nodes. For example, when a first node receives a decoding result of a second node from the second node, the first node performs decoding using the decoding result of the second node and transmits its own decoding result to a third node connected thereto.

In this regard, a decoding operation performed in the check node is referred to as a check node operation, and a decoding operation performed in the variable node is referred to as a variable node operation.

A tentative code is generated through the check node operation and the variable node operation, and a parity check is performed to determine whether the generated tentative code is a valid codeword.

If the generated tentative code is a valid codeword, the decoding operation is terminated. If the generated tentative code is not a valid codeword, the decoding operation is iteratively performed.

Figure 2:
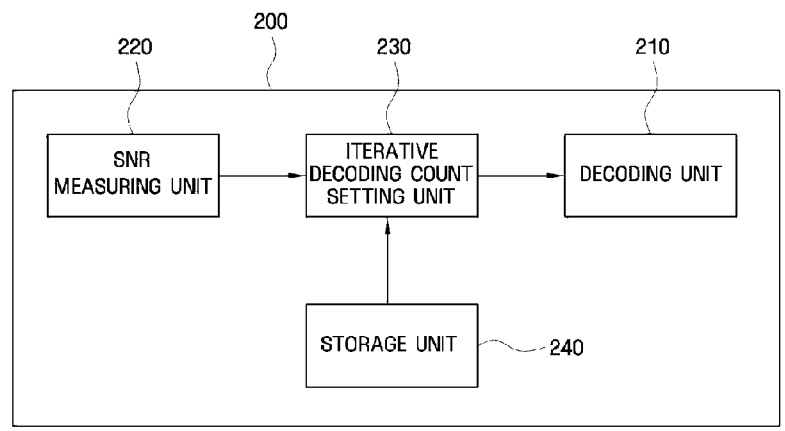
FIG. 2 is a detailed block diagram of an iterative decoder according to an embodiment of the present invention.

FIG. 2 is a detailed block diagram of an iterative decoder 200 according to an embodiment of the present invention.

Referring to FIG. 2, the iterative decoder 200 according to the present embodiment includes a decoding unit 210, a signal-to-noise (SNR) estimation unit 220, and an iterative decoding count setting unit 230, functions of which will be described below in detail.

The decoding unit 210 iteratively decodes a received signal to restore a valid codeword from the received signal.

Here, each decoding operation of the iterative decoding includes a tentative decoding and error check.

The tentative decoding refers to a decoding operation performed on the received signal or a previously decoded tentative code, and the error check refers to a checking operation performed to determine whether the decoded tentative code is a valid codeword.

In an exemplary embodiment, when the iterative decoder 200 is a LDPC decoder that decodes a received signal using LDPC decoding, the tentative decoding includes a check node operation and a variable node operation, and the error check includes a parity check.

According to an embodiment of the present invention, the decoding unit 210 selectively performs the error check based on the minimum number of iteration counts, which will later be described in more detail.

The SNR estimation unit 220 estimates an SNR of the received signal.

In this case, the SNR estimation unit 220 may estimate the SNR of the received signal using any known SNR estimation method.

The iterative decoding count setting unit 230 sets the minimum number of iteration counts for the received signal based on the estimated SNR.

In general, the number of iterative decoding operations performed to restore a valid codeword from a received signal, that is, the number of iteration counts of iterative decoding, differ according to the SNR of the received signal.

Next, in a case of decoding a received signal based on LDPC decoding, a relationship between the number of iterative decoding operations and the SNR of the received signal will be described with reference to Table 1.

TABLE 1

| SNR | Number of Iterative Decoding operations | | |
|---|---|---|---|
| (dB) | Min | Max | Avg |
| −1 | 50 | 50 | 50 |
| −0.5 | 50 | 50 | 50 |
| 0 | 50 | 50 | 50 |

TABLE 1-continued

| SNR | Number of Iterative Decoding operations | | |
|---|---|---|---|
| (dB) | Min | Max | Avg |
| 0.5 | 50 | 50 | 50 |
| 1 | 42 | 50 | 49.88 |
| 1.5 | 10 | 50 | 21.51 |
| 2 | 6 | 19 | 10.94 |
| 2.5 | 4 | 11 | 7.75. |
| 3 | 4 | 9 | 6.03 |
| 3.5 | 4 | 7 | 4.91 |
| 4 | 3 | 6 | 4.1 |
| 4.5 | 2 | 5 | 3.45 |
| 5 | 2 | 4 | 3.02 |
| 5.5 | 2 | 4 | 2.6 |
| 6 | 2 | 4 | 2.16 |
| 6.5 | 1 | 3 | 2.02 |
| 7 | 1 | 3 | 1.86 |
| 7.5 | 1 | 3 | 1.48 |
| 8 | 1 | 2 | 1.16 |
| 8.5 | 1 | 2 | 1.04 |
| 9 | 1 | 2 | 1.01 |
| 9.5 | 1 | 2 | 1 |
| 10 | 1 | 2 | 1 |
| 10.5 | 1 | 2 | 1 |
| 11 | 1 | 1 | 1 |
| 11.5 | 1 | 1 | 1 |
| 12 | 1 | 1 | 1 |

A maximum value (Max), a minimum value (Min), and an average (Avg) of the number of iterative decoding operations according to the SNR of the received signal for 1,000,000 symbols are shown in Table 1, in which when the iterative decoding is performed on the received signal coded using the LDPC code having an information block having a length of 4608 and dimensions of 9216 with a coding rate of 1/2.

Referring to Table 1, as the SNR of the received signal increases, the maximum value (Max), the minimum value (Min), and the average (Avg) of the number of iterative decoding operations are reduced.

In other words, when the SNR of the received signal has a large value, the decoding unit 210 may perform a small number of decoding operations. However, when the SNR of the received signal has a small value, the decoding unit 210 should perform a large number of decoding operations.

For example, referring to Table 1, when the SNR of the received signal has a value of 2 dB, the decoding unit 210 should perform a minimum number of 6 and a maximum number of 19 iteration counts of iterative decoding.

Therefore, in a decoding stage, in which the number of decoding operations is less than the minimum number of iterative decoding operations, (to be called an 'initial stage' for convenience), the tentative code restored through the tentative decoding has a low probability that the error check is satisfied (that is, a probability that the tentative code is a valid codeword is low), the error check performed in the initial decoding stage is a redundant operation.

According to an embodiment of the present invention, when the number of iteration counts of the tentative decoding is less than or equal to the set minimum number of iteration counts, the decoding unit 210 does not perform the error check; that is, the decoding unit 210 performs only tentative decoding. When the number of iteration counts of the tentative decoding is greater than the set minimum number of iteration counts, the decoding unit 210 may perform both tentative decoding and error check.

For example, when the SNR of the received signal has a value of 2 dB, the minimum number of iterative decoding operations performed to restore the valid codeword from the received signal is 6, the decoding unit 210 performs only tentative decoding in the first to fifth decoding steps and then performs both tentative decoding and error check from the sixth decoding step.

Accordingly, since the redundant error check performed in the initial stage is omitted, the number of decoding operations is reduced, thereby reducing a processing time and power consumption. In particular, when the SNR of the received signal has a small value, the minimum value (Min) of the number of iterative decoding operations is large, thereby efficiently reducing the processing time and power consumption.

Hereinafter, the power consumed by the iterative decoder 200 according to an embodiment of the present invention is compared with the power consumed by a conventional iterative decoder and a relationship between the SNR of a received signal and the power consumed will be described.

Figure 3:
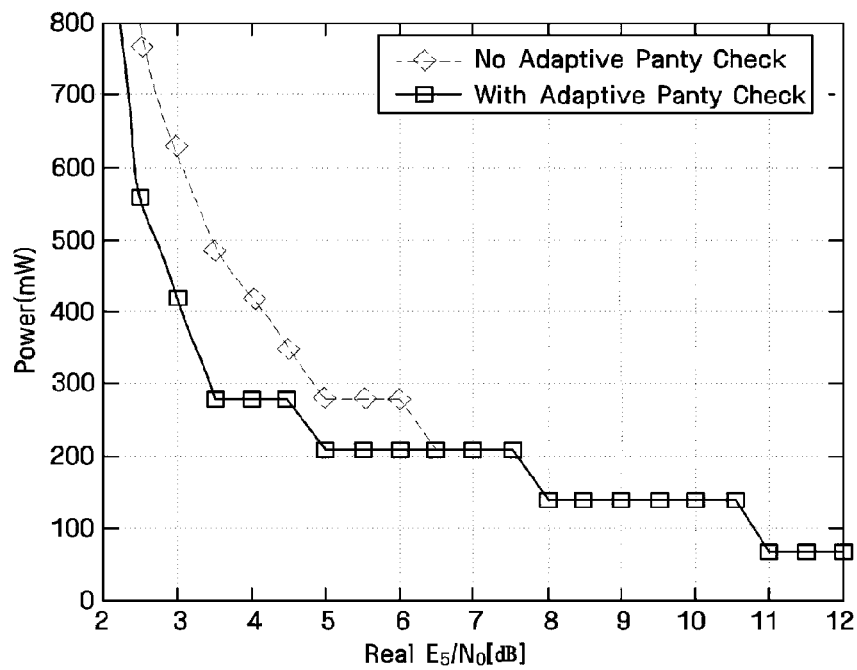
FIG. 3 is a graph illustrating a relationship between the signal-to-noise (SNR) ratio of a received signal and power consumed when the received signal is decoded using an iterative decoder according to an embodiment of the present invention.

FIG. 3 illustrates a relationship between SNR of a received signal and power consumed when the received signal is decoded using an iterative decoder (200) according to an embodiment of the present invention.

For example, when the SNR of the received signal has a value of 2.5 dB, 557 mW of power is consumed with an adaptive parity check in the present invention, while 766 mW of power is consumed without an adaptive parity check in the conventional art. Therefore, according to the present invention, 208 mW of power can be saved.

Referring to FIG. 3, when the SNR of the received signal is in a range of 2 dB to 6.5 dB, a difference in the power consumption is generated. However, when the SNR of the received signal has a value greater than or equal to 6.5 dB, there is little difference in the power consumed by the iterative decoder 200 according to the present invention and the conventional iterative decoder for the following reason. That is to say, when the SNR of the received signal has a large value, the valid codeword can be restored from the received signal with a small number of iteration counts of iterative decoding.

Referring back to FIG. 2, the iterative decoder 200 according to an embodiment of the present invention will be described in more detail.

According to an embodiment of the present invention, the iterative decoder 200 may further include a storage unit 240.

The storage unit 240 connects at least one SNR with at least one minimum number of iteration counts in a corresponding manner and stores the same.

In this case, the iterative decoding count setting unit may read the minimum number of iteration counts corresponding (that is, closest or most likely) to the SNR of the received signal measured by the SNR measuring unit 220 from the storage unit 240 and may set the read minimum number of iteration counts as the minimum number of iteration counts for the received signal.

Here, the minimum number of iteration counts corresponding to the SNR of the received signal can be experimentally determined.

In an exemplary embodiment of the present invention, for 1,000,000 symbols, when the iterative decoding is performed on the received signal coded using the LDPC code having an information block having a length of 4608 and dimensions of 9216 with a coding rate of 1/2, the storage unit 240 may store a look up table (LUT) as shown in Table 2. In this case, the iterative decoding count setting unit 230 may set the minimum number of iterative counts for the received signal based on the LUT.

TABLE 2

| SNR(dB) | ≤0.5 | 1 | 1.5 | 2 | 2.5 | 3 | 3.5 |
|---|---|---|---|---|---|---|---|
| Minimum number of iterative decoding operations | 49 | 41 | 9 | 5 | 3 | 3 | 3 |
| SNR(dB) | 4 | 4.5 | 5 | 5.5 | 6 | ≥6.5 | |
| Minimum number of iterative decoding operations | 2 | 1 | 1 | 1 | 1 | 0 | |

In the foregoing discussion, the iterative decoder 200 decodes the received signal using LDPC decoding, which is provided for convenience of explanation, and it will be understood by those skilled in the art that the invention can also be applied to a decoder for iterative decoding using tentative decoding and error check.

Next, a method of setting the number of iteration counts in iterative decoding, and a method of iterative decoding according to an embodiment of the present invention will be described with reference to FIG. 4.

Figure 4:
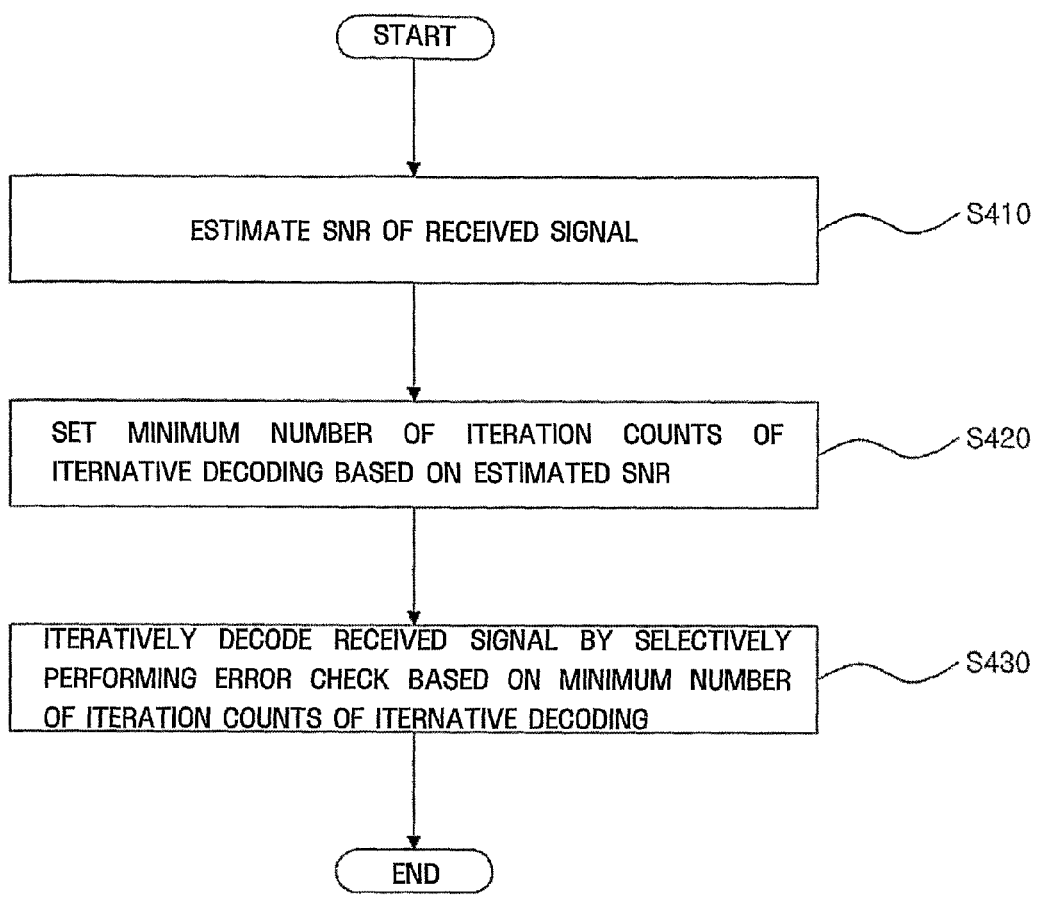
FIG. 4 is a flow chart illustrating a method of setting a number of iteration counts in iterative decoding, and a method of iterative decoding according to an embodiment of the present invention.

FIG. 4 is a flow chart illustrating a method of setting the number of iteration counts in iterative decoding, and a method of iterative decoding according to an embodiment of the present invention.

Referring to FIG. 4, the method of iterative decoding according to an embodiment of the present invention includes steps S410 through S430. Here, the method of iterative decoding according to an embodiment of the present invention may be composed of steps S410 and S420.

In step S410, the SNR of a received signal is estimated.

In step S420, the minimum number of iteration counts of iterative decoding is set based on the estimated SNR.

Finally, in step S430, the received signal is iteratively decoded using tentative decoding and error check. In this step, the error check may be selectively performed based on the minimum number of iteration counts of iterative decoding.

For example, when the number of iteration counts of the tentative decoding is less than or equal to the minimum number of iteration counts, the error check is not performed in the iteratively decoding in step S430. When the number of iteration counts of the tentative decoding is greater than the minimum number of iteration counts, both tentative decoding and error check may be performed in step S430.

In this case, according to an embodiment of the present invention, the minimum number of iteration counts is inversely proportional to the SNR of the received signal.

In addition, according to an embodiment of the present invention, In step S420, the minimum number of iteration counts of iterative decoding may be set using a storage unit that connects the SNR with the minimum number of iteration counts in a corresponding manner and stores the same. In this case, in step S430, the minimum number of iteration counts corresponding to the estimated SNR may be read from the storage unit and the read minimum number of iteration counts may be set as the minimum number of iteration counts for the received signal.

Further, as described above, the method of iterative decoding according to an embodiment of the present invention may also be applied to LDPC decoding based on a LDPC decoding scheme.

The method of iterative decoding according to an embodiment of the present invention has been described in conjunction with the foregoing embodiments, and the configuration of the iterative decoder 200 shown in FIG. 2 can also be applied to the present embodiment, a detailed description of which will not be provided.

FIG. 5 illustrates an algorithm of a LDPC decoding process as an example of iterative decoding according to an embodiment of present invention.

In the LDPC decoding algorithm illustrated in FIG. 5, lines 3 and 4 represent a check node operation process, lines 5 and 6 represent a variable node operation process, and lines 7 through 12 represent a parity check process. In the LDPC decoding algorithm illustrated in FIG. 5, i denotes the number of iteration counts of iterative decoding, $F_n$, denotes symbol data contained in the received signal, $H_{mn}$ denotes the element of column m, row n in the parity check matrix, $Z_{MN}$ denotes the data matrix element of a variable node, $i_{max}$ denotes the maximum number of iteration counts of iterative decoding, $i_{min}$ denotes the minimum number of iteration counts of iterative decoding, $L_{MN}$ denotes the data matrix element of a check node, ĉ denotes a tentative code, and $Z_N$ denotes a tentative value for generating the tentative code ĉ, respectively.

The LDPC decoding algorithm illustrated in FIG. 5 is substantially the same as the conventional LDPC decoding algorithm, except that lines 7 and 12 are additionally provided.

Lines 7 and 12 are additionally provided for selectively performing parity check. In line 7, it is determined whether a value of i, that is, the number of iteration counts, in the current decoding process is greater than the minimum number of iteration counts of iterative decoding $i_{MIN}$. As described above, the minimum number of iteration counts of iterative decoding $i_{MIN}$ is determined according to the SNR of the received signal.

When the i value is less than the minimum number of iteration counts of iterative decoding $i_{MIN}$, the process represented by lines 8 through line 11 is not performed, that is, the parity check is not performed, while when the i value is greater than the minimum number of iteration counts of iterative decoding $i_{MIN}$, the process represented by lines 8 through line 11 is performed, that is, the parity check is performed. Accordingly, the parity check is not performed in the decoding processes in which the i value is less than the minimum number of iteration counts of iterative decoding.

In addition, the embodiments of the present invention may include a computer readable media containing program instructions to execute operations realized by various computers. The computer readable medium may include the program instructions, data files, data structures or combinations thereof. Examples of the program instructions include computer program instructions that are specially designed or configured to implement the present invention or other well-known program instructions that can be readily used by persons skilled in the art. Examples of the computer readable media include hard disks, magnetic media such as floppy disks and magnetic tape, optical media such as CDs and DVDs, magneto-optic media such as floptical disks, and hardware devices containing and executing program instructions such as ROM, RAM, and flash memory.

In order to perform the operations illustrated in the embodiments of the invention, the aforementioned hardware devices may also configured to operate as one or more software modules or may be configured in the reverse order.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

INDUSTRIAL APPLICABILITY

Since the redundant error check performed in the initial stage is omitted, the number of decoding operations is reduced, thereby reducing a processing time and power consumption. In particular, when the SNR of the received signal has a small value, the minimum value (Min) of the number of iterative decoding operations is large, thereby efficiently reducing the processing time and power consumption.

The invention claimed is:

1. A low density parity check (LDPC) decoder comprising:
a signal-to-noise ratio (SNR) estimation unit that estimates an SNR of a received signal;
an iterative decoding count setting unit that sets a minimum number of iteration counts for the received signal based on the estimated SNR; and
a decoding unit that iteratively decodes the received signal using tentative decoding and error check, and selectively performs the error check based on the minimum number of iteration counts,
wherein, the decoding unit does not perform the error check when a number of iteration counts of the decoding is less than or equal to the minimum number of iteration counts.

2. The LDPC decoder of claim 1, wherein, when a number of iteration counts of the decoding is greater than the minimum number of iteration counts, the decoding unit performs the error check.

3. The LDPC decoder of claim 1, wherein the minimum number of iteration counts is inversely proportional to the SNR.

4. The LDPC decoder of claim 1, further comprising a storage unit that connects at least one SNR with at least one minimum number of iteration counts in a corresponding manner and stores the same, wherein the iterative decoding count setting unit reads the minimum number of iteration counts corresponding to the estimated SNR from the storage unit and sets the minimum number of iteration counts.

5. A method of setting a number of iteration counts of low density parity check (LDPC) decoder, the method comprising:
estimating a signal to noise ratio (SNR) of a received signal;
setting a minimum number of iteration counts based on the estimated SNR; and
decoding the received signal iteratively using tentative decoding and error check,
wherein, the error check is not performed in decoding when a number of iteration counts of the decoding is less than or equal to the minimum number of iteration counts.

6. A low density parity check (LDPC) decoder comprising:
a signal-to-noise ratio (SNR) estimation unit that estimates an SNR of a received signal;
an iterative decoding count setting unit that sets a minimum number of iteration counts for the received signal based on the estimated SNR; and
a decoding unit that iteratively decodes the received signal using check node operation, variable node operation, tentative decoding and error check,
wherein, the decoding unit does not perform the error check and the tentative decoding when a number of iteration counts of the decoding is less than or equal to the minimum number of iteration counts.

7. A method of low density parity check (LDPC) decoding comprising:
estimating a signal to noise ratio (SNR) of a received signal;
setting a minimum number of iteration counts for the received signal based on the estimated SNR; and
iteratively decoding the received signal using check node operation, variable node operation, tentative decoding and error check,
wherein, the error check and the tentative decoding is not performed in decoding when a number of iteration counts of the decoding is less than or equal to the minimum number of iteration counts.

* * * * *